(12) United States Patent
Koo

(10) Patent No.: US 7,345,452 B2
(45) Date of Patent: Mar. 18, 2008

(54) METHOD OF CALCULATING SOC OF BATTERY FOR PREVENTION OF MEMORY EFFECT

(75) Inventor: Jae-Seung Koo, Hwaseong-si (KR)

(73) Assignee: Hyundai Motor Company, Seoul (KR)

( * ) Notice: Subject to any disclaimer, the term of this patent is extended or adjusted under 35 U.S.C. 154(b) by 181 days.

(21) Appl. No.: 11/299,366

(22) Filed: Dec. 8, 2005

(65) Prior Publication Data
US 2006/0132094 A1    Jun. 22, 2006

(30) Foreign Application Priority Data
Dec. 21, 2004 (KR) ............... 10-2004-0109811

(51) Int. Cl.
*H02J 7/00* (2006.01)
(52) U.S. Cl. ............... 320/132; 320/134; 320/136
(58) Field of Classification Search ............... 320/132, 320/134, 136
See application file for complete search history.

(56) References Cited

U.S. PATENT DOCUMENTS

| 6,608,482 | B2 * | 8/2003 | Sakai et al. ............... 324/426 |
| 6,700,383 | B2 * | 3/2004 | Kimura et al. ............... 324/429 |
| 2001/0035742 | A1 * | 11/2001 | Ito et al. ............... 320/157 |
| 2006/0152195 | A1 * | 7/2006 | Ishishita ............... 320/132 |

FOREIGN PATENT DOCUMENTS

| JP | 11-146505 | | 5/1999 |
| JP | 2000175306 | A * | 6/2000 |
| JP | 2001-224103 | | 8/2001 |
| JP | 2001-314040 | | 11/2001 |
| JP | 2001-314041 | | 11/2001 |
| JP | 2003-047108 | | 2/2003 |
| JP | 2004166350 | A | 6/2004 |
| JP | 2004-286642 | | 10/2004 |

OTHER PUBLICATIONS

The Abstract and an English translation of JP 2000175306 A, is attached.*

* cited by examiner

*Primary Examiner*—Bao Q. Vu
*Assistant Examiner*—Ramy Ramadan
(74) *Attorney, Agent, or Firm*—Morgan Lewis & Bockius LLP

(57) ABSTRACT

Disclosed herein is a method of calculating the SOC of a battery. The method includes the steps of receiving information about a previous SOC mode and operation time in the mode from memory of a battery controller after startup of the vehicle; calculating a battery SOC data value using one of respective different reference capacities depending on whether a normal SOC preservation mode, a high SOC range expansion mode, or a low SOC range expansion mode using the battery controller and transmitting the battery SOC data value to a vehicle controller; and determining whether conditions for entering a next SOC mode is met after calculation of an actual SOC value of the battery in the normal SOC preservation mode, the high SOC range expansion mode, or the low SOC range expansion mode.

2 Claims, 3 Drawing Sheets

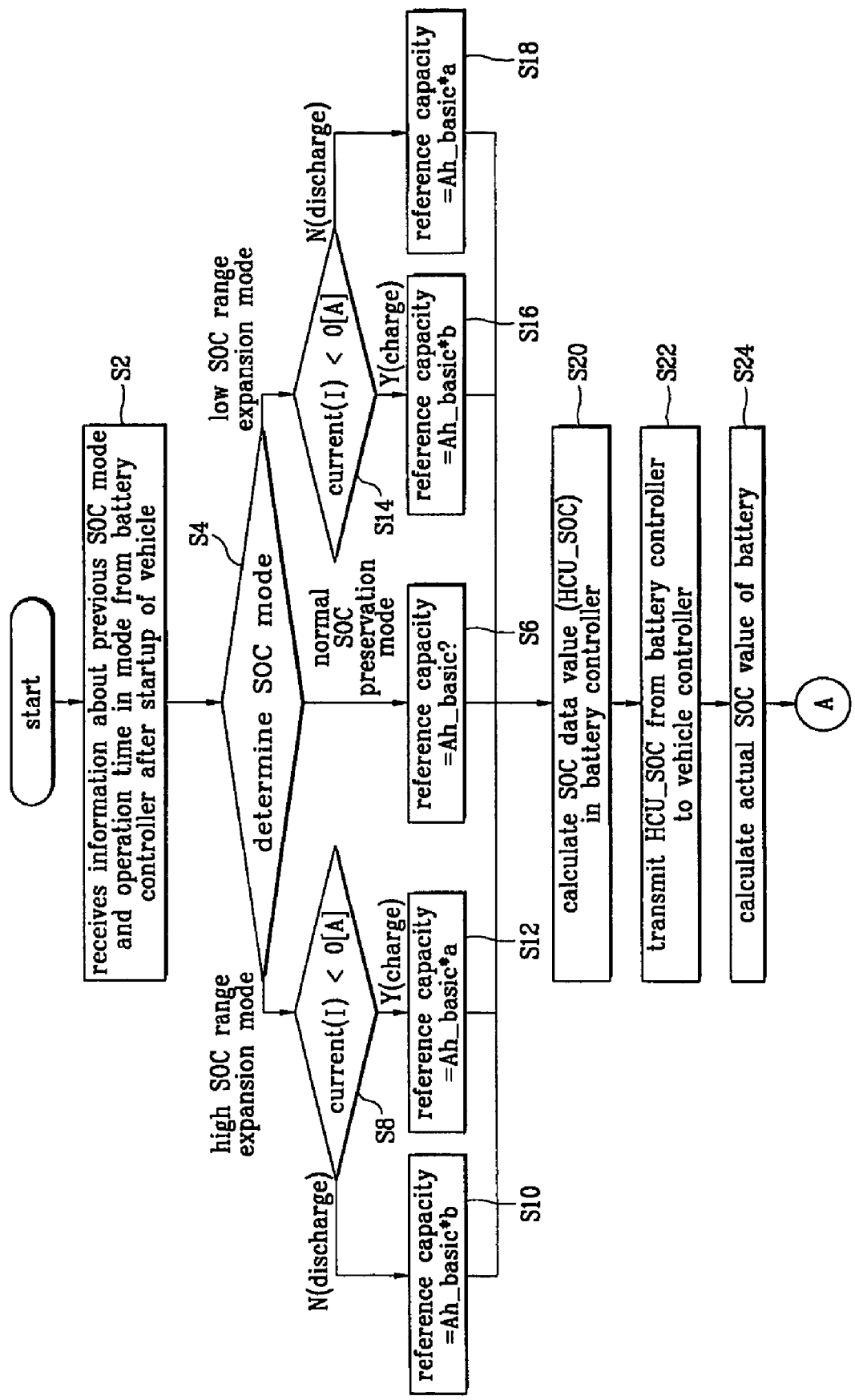

METHOD OF CALCULATING SOC OF BATTERY FOR PREVENTION OF MEMORY EFFECT

CROSS-REFERENCE TO RELATED APPLICATIONS

The present application is based on, and claims priority from, Korean Application Serial Number 10-2004-0109811, filed on Dec. 21, 2004, the disclosure of which is hereby incorporated by reference herein in its entirety.

FIELD OF THE INVENTION

The present invention relates generally to a method of calculating the State Of Charge (SOC) of a battery for prevention of a memory effect and, more particularly, to a method of calculating the SOC of a battery for prevention of a memory effect, which prevents a decrease in the actual available maximum capacity of the battery due to the memory effect occurring when the power of the battery installed in a vehicle is repeatedly used within a certain range, that is, in a urban driving mode. For reference, the memory effect occurs in a Ni-type battery, and refers to a phenomenon in which, when the battery is continuously used in a certain range rather than using 100% of the capacity of the battery, the capacity of the continuous use range is considered the maximum capacity, thus decreasing the actual available maximum capacity of the battery.

BACKGROUND OF THE INVENTION

Recently, a hybrid vehicle that can operate using electrical power has been actively developed. The hybrid vehicle is equipped with a battery charged with power, and uses the power charged in the battery at the time of operation. Such a hybrid vehicle improves power performance and decreases gas mileage based on an algorithm of operating a motor and an engine depending on the SOC of a high voltage battery.

FIG. 1 is a diagram showing a case where the SOC calculated by the battery controller of a hybrid vehicle is continuously within a range of ±5% of a base SOC at the time of normal urban driving. The SOC is calculated using the following Equation $$soc[n] = soc[n-1] - \frac{\sum_{n-1}^{n} I}{Ah\_basic} \times 100[\%] \quad (1)$$

wherein SOC is the state of charge, I is the charged/discharged current of the battery, and Ah_basic is the reference capacity (rated capacity).

However, as illustrated in FIG. 1, in the case where the hybrid vehicle continuously repeats a normal urban driving mode, the battery experiences a memory effect, so that 100% of the rated capacity of the battery may not be used. That is, if the SOC is continuously within a range of ±5% of the base SOC, a problem occurs in that the maximum capacity of the battery decreases, thereby shortening the lifetime of the battery.

SUMMARY OF THE INVENTION

Embodiments of the present invention provide a method of calculating the SOC of a battery, which prevents a memory effect from occurring when the battery installed in a hybrid vehicle is repeatedly used in a certain range (a certain driving mode), thereby preemptively preventing a decrease in the available maximum capacity of the battery.

The method includes the steps of receiving information about a previous SOC mode and operation time in the mode from memory of a battery controller after startup of the vehicle; calculating a battery SOC data value using one of respective different reference capacities depending on whether a normal SOC preservation mode, a high SOC range expansion mode, or a low SOC range expansion mode using the battery controller and transmitting the battery SOC data value to a vehicle controller; and determining whether conditions for entering a next SOC mode is met after calculation of an actual SOC value of the battery in the normal SOC preservation mode, the high SOC range expansion mode, or the low SOC range expansion mode.

BRIEF DESCRIPTION OF THE DRAWINGS

For a better understanding of the nature and objects of the present invention, reference should be made to the following detailed description with the accompanying drawings, in which.

DETAILED DESCRIPTION OF THE PREFERRED EMBODIMENTS

Figure 1:
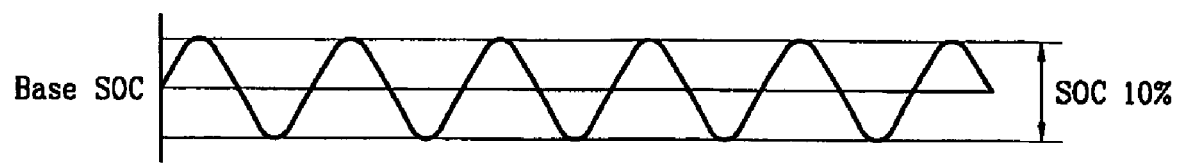
FIG. 1 is a waveform diagram showing the SOC of a conventional battery.
Figure 2:
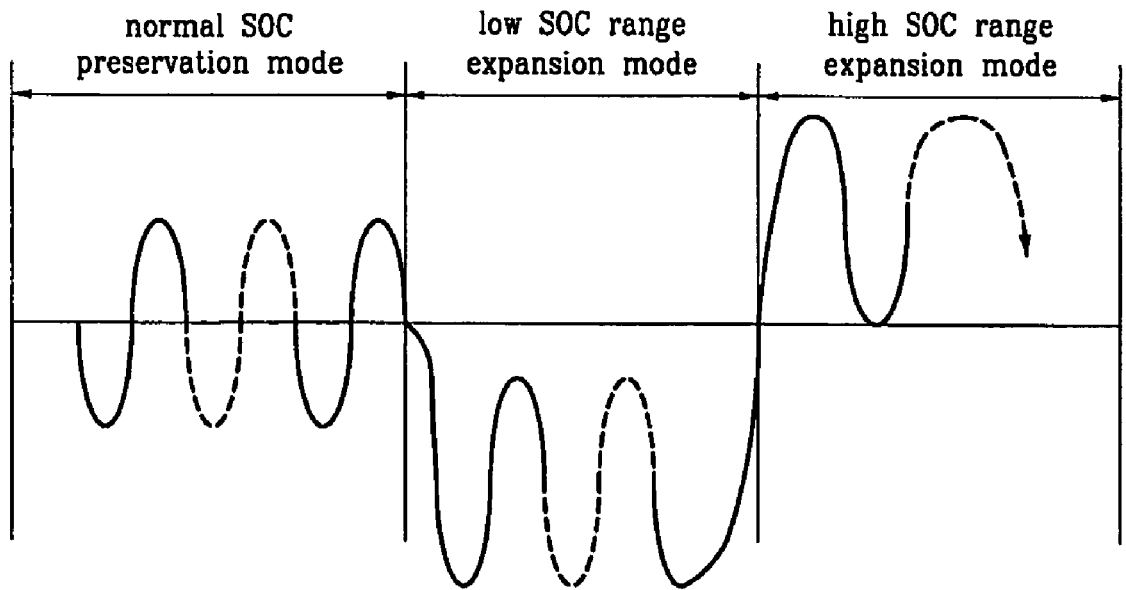
FIG. 2 is a waveform diagram showing the SOC of a battery according to the present invention.
Figure 3B:
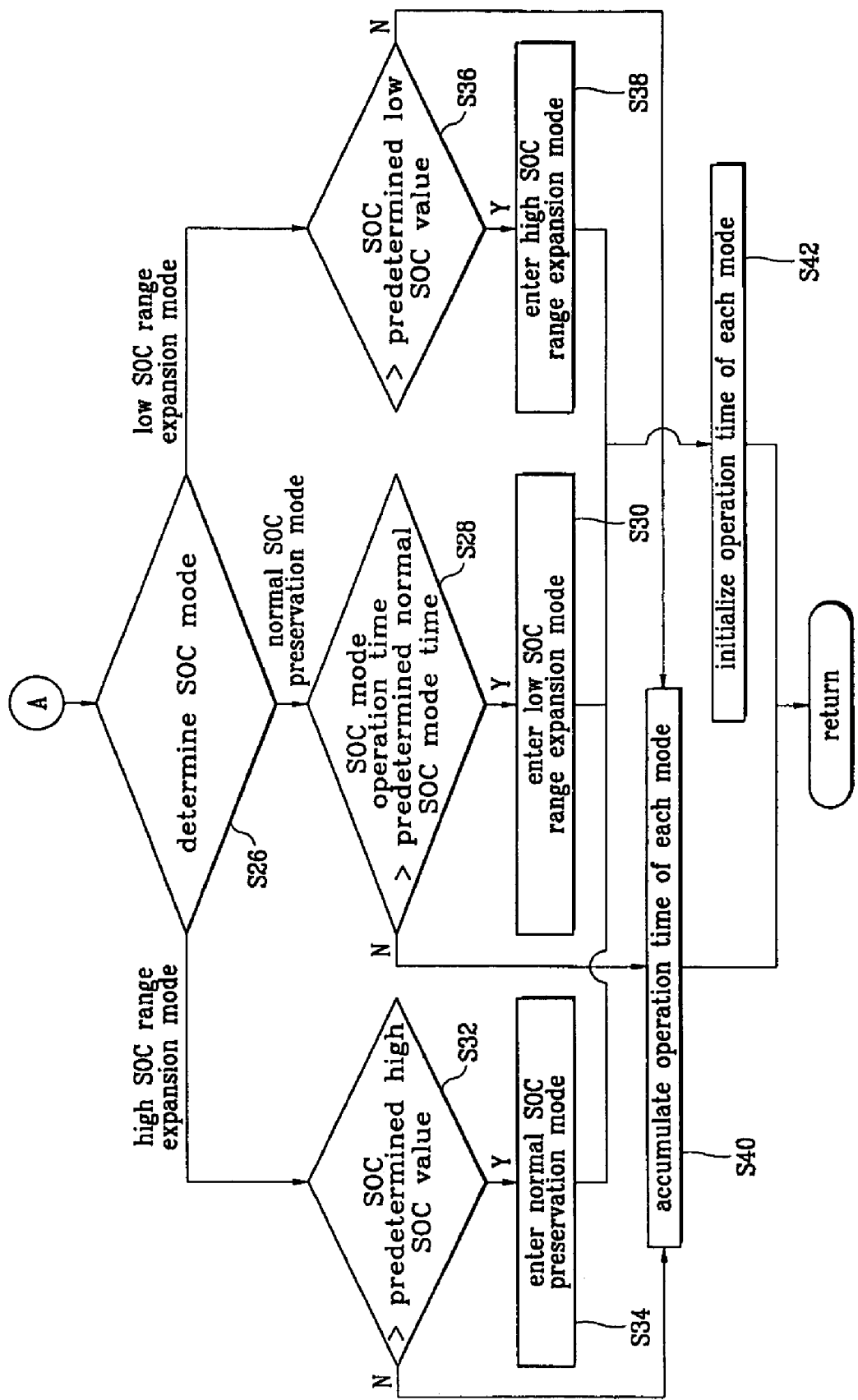
FIG. 3 is a flowchart illustrating a method of preventing a memory effect according to the present invention.

FIG. 2 is a waveform diagram showing the SOC of a battery according to the present invention, and FIG. 3 is a flowchart illustrating a method of preventing a memory effect according to the present invention.

The present invention relates to a method of calculating an SOC to prevent a memory effect from occurring in a battery. In order to prevent the memory effect that occurs when a hybrid vehicle operates repeatedly in a certain mode, for example, a urban driving mode, the SOC is calculated as represented by the following Equation 2:

$$soc[n] = soc[n-1] - \frac{\sum_{n-1}^{n} I}{Ah\_basic} \times 100[\%] \quad (2)$$

wherein SOC is the state of charge, I is the charge or discharge current of the battery, and Ah_basic is the reference capacity (rated capacity).

Comparing Equation 2 with Equation 1, the terms of one equation are identical to those of the other. However, in the present invention, the basic capacity of the battery, which is represented by the Ah_basic variable, is divided into a normal SOC preservation mode, a high SOC range expansion mode, and a low SOC range expansion mode, and different values are applied to the normal SOC preservation mode, the high SOC range expansion mode, and the low SOC range expansion mode, depending on the charge or discharge of the battery.

The reference capacities of the respective modes are shown in the following table 1.

|  | Reference current capacity (Ah_basic) | |
| --- | --- | --- |
| Classification | Battery charge (I < 0[A]) | Battery discharge (I > 0[A]) |
| Normal SOC preservation mode | Ah_basic | Ah_basic |
| High SOC range expansion mode | Ah_basic * (a) | Ah_basic * (b) |
| Low SOC range expansion mode | Ah_basic * (b) | Ah_basic * (a) |

As illustrated in table 1, the normal SOC preservation mode uses the reference capacity Ah_basic, which is the same for a charge mode and a discharge mode, so that a normal charge state can be maintained. In the high SOC range expansion mode, the reference capacity Ah-basic is multiplied by a gain coefficient 'a' at the time of charging, and the reference capacity Ah-basic is multiplied by a gain coefficient 'b' at the time of discharge. For example, when 'a' is set to a value (for example, 1.1) larger than 1, 'b' is set to a value (for example, 0.9) smaller than 1, and the SOC is calculated using Equation 2, the SOC, which is applied to a vehicle controller, is calculated as a value smaller than an actually charged amount at the time of charging, and is calculated as a value larger than an actually discharged amount at the time of discharge, thereby inducing the battery to enter a highly charged state (high SOC) in practice.

In the same manner, in the low SOC range expansion mode, the SOC is calculated as a value larger than an actually charged amount at the time of charging, and is calculated as a value smaller than an actually discharged amount at the time of discharge, thereby inducing the battery to enter a low SOC range in practice.

The conditions for determining entry into the above-described modes are described as follow.

In the normal SOC preservation mode, when an SOC change cycle, that is, mode operation time, exceeds a predetermined time, the vehicle controller enters the low SOC range expansion mode. In the low SOC range mode, when the SOC exceeds a predetermined SOC, the vehicle controller enters the high SOC range expansion mode. In the high SOC range expansion mode, when the SOC exceeds a predetermined SOC, the vehicle controller enters the normal SOC range preservation mode. Then, in the respective corresponding modes, the SOCs are calculated.

As described above, the vehicle controller according to the present invention uses a driving strategy depending on the SOC. However, when the SOC calculation algorithm (low SOC range expansion and high SOC range expansion) is employed, the actual charged state of the battery has a wide SOC range (normal SOC preservation mode, low SOC range expansion mode, and high SOC range expansion mode) as shown in FIG. 2, thereby preventing the memory effect.

FIG. 3 is a flowchart illustrating a method of calculating an SOC value to prevent the memory effect, according to the present invention.

As illustrated in FIG. 3, after a vehicle has received a key-on signal and has been started up, a battery controller fetches information about a previous SOC mode and operation time in the mode at step S2. Then, logic with the SOC mode taken into consideration is conducted at step S4.

That is, in the normal SOC preservation mode, an SOC data value (HCU_SOC) to be transmitted to the vehicle controller is calculated using the battery reference capacity at step S6. In the high SOC expansion mode, the SOC data value is calculated using a value (Ah_basic*a (constant value bigger than 1)) larger than Ah_basic at the time of charging and using a value (Ah_basic*b (constant value smaller than 1)) smaller than Ah_basic at the time of discharge at steps S8 to S12. In the low SOC expansion mode, the SOC data value is calculated using a value (Ah_basic*b (constant value smaller than 1)) smaller than Ah_basic at the time of charging and using a value (Ah_basic*a (constant value bigger than 1)) larger than Ah_basic at the time of discharge at steps S14 to S18. Then, the calculated HCU_SOC is transmitted to the vehicle controller. In this case, the calculation of the HCU_SOC value to be transmitted to the vehicle controller is identical to the calculation of Equation 2, but the reference capacities (the reference capacity is multiplied by the gain coefficients) are different depending on the respective modes.

After the transmission of the calculated data value HCU_SOC from the battery controller to the vehicle controller at steps S20 and S22, the actual SOC value of the battery is calculated using Equation 2 at step S24. That is, in the normal SOC preservation mode, or the low or high SOC expansion mode, the actual SOC value of the battery is calculated using a general reference capacity. For reference, at step S20, the actual SOC values of the battery are calculated using the reference capacities in which the gain coefficients a and b have been taken into account. In contrast, at step S24, the actual SOC value of the battery is calculated using the reference capacity in which the gain coefficients a and b not have been taken into account.

Meanwhile, after the calculation of the SOC value of the battery, the actual SOC value is calculated using the reference battery capacity in order to calculate the actual SOC value of the battery in a certain SOC mode, and then whether the conditions for entering a specific SOC mode have been met is determined at step S26.

That is, if, in the normal SOC preservation mode, the operation time exceeds a predetermined normal SOC mode time, the low SOC range expansion mode is entered at steps S28 and S30. Otherwise, the mode operation time is accumulated and the process returns to the initial step at step S40. Furthermore, if, in the low SOC range expansion mode, the SOC is larger than a predetermined low SOC value, the high SOC range expansion mode is entered at steps S36 and S38. Otherwise, the mode operation time is accumulated and then the process returns to the initial step at step S40. Similarly, if, in the high SOC range expansion mode, the SOC is larger than a predetermined high SOC value, the normal SOC preservation mode I is entered at steps S32 and S34. Otherwise, the mode operation time is accumulated and then the process returns to the initial step at step S40.

Meanwhile, after the entry from the normal SOC preservation mode, or the low or high SOC range expansion mode to a different corresponding mode, the operation time in the previous mode is initialized in order to calculate the SOC in the corresponding mode, at step S32.

As described above, even if a battery installed in a hybrid vehicle is repeatedly used in a specific mode, the present invention switches the SOC mode to prevent a memory effect, thereby preemptively preventing a decrease in the available energy of a battery due to the memory effect, improving vehicle efficiency, and increasing the lifetime of the battery.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of calculating an SOC (State Of Charge) of a battery of a hybrid vehicle, comprising the steps of:
   receiving information about a previous SOC mode and operation time in the mode from memory of a battery controller after startup of the vehicle;
   calculating a battery SOC data value using one of respective different reference capacities depending on whether a normal SOC preservation mode, a high SOC range expansion mode, or a low SOC range expansion mode is detected using the battery controller and transmitting the battery SOC data value to a vehicle controller; and
   determining whether conditions for entering a next SOC mode is met after calculation of an actual SOC value of the battery in the normal SOC preservation mode, the high SOC range expansion mode, or the low SOC range expansion mode;
   wherein the calculation of the SOC data value (HCU_SOC) is performed by calculating the SOC data value (HCU_SOC), which will be transmitted to the vehicle controller using the battery reference capacity (Ah_basic) in the normal SOC preservation mode, calculating the SOC data value using a value larger than the reference capacity (Ah_basic) at a time of charging and using a value smaller than (Ah_basic) at a time of discharging in the high SOC expansion mode, and calculating the SOC data value using a value smaller than the reference capacity (Ah_basic) at the time of charging and using a value larger than the reference capacity (Ah_basic) at the time of discharging in the low SOC expansion mode.

2. A method of calculating an SOC (State Of Charge) of a battery of a hybrid vehicle, comprising the steps of:
   receiving information about a previous SOC mode and operation time in the mode from memory of a battery controller after startup of the vehicle;
   calculating a battery SOC data value using one of respective different reference capacities depending on whether a normal SOC preservation mode, a high SOC range expansion mode, or a low SOC range expansion mode is detected using the battery controller and transmitting the battery SOC data value to a vehicle controller; and
   determining whether conditions for entering a next SOC mode is met after calculation of an actual SOC value of the battery in the normal SOC preservation mode, the high SOC range expansion mode, or the low SOC range expansion mode;
   wherein the entry to a specific mode is performed by entering the low SOC range expansion mode if a mode operation time exceeds a predetermined time in the normal SOC preservation mode, entering the high SOC range expansion mode if the SOC data value is larger than a predetermined value of the low SOC range expansion mode in the low SOC range expansion mode, and entering the normal SOC preservation mode if the SOC data value is larger than a predetermined value of the high SOC range expansion mode in the high SOC range expansion mode, and then determining whether the conditions for entering the next SOC mode, in which the SOC value of the battery is calculated using a corresponding reference capacity in the corresponding SOC mode, is met.

* * * * *